United States Patent
Sadaka et al.

(10) Patent No.: US 9,136,134 B2
(45) Date of Patent: Sep. 15, 2015

(54) METHODS OF PROVIDING THIN LAYERS OF CRYSTALLINE SEMICONDUCTOR MATERIAL, AND RELATED STRUCTURES AND DEVICES

(75) Inventors: Mariam Sadaka, Austin, TX (US); Ionut Radu, Crolles (FR)

(73) Assignee: SOITEC, Bernin (FR)

( * ) Notice: Subject to any disclaimer, the term of this patent is extended or adjusted under 35 U.S.C. 154(b) by 129 days.

(21) Appl. No.: 13/402,464

(22) Filed: Feb. 22, 2012

(65) Prior Publication Data

US 2013/0217206 A1    Aug. 22, 2013

(51) Int. Cl.
| | |
|---|---|
| H01L 21/30 | (2006.01) |
| H01L 21/46 | (2006.01) |
| H01L 21/302 | (2006.01) |
| H01L 21/306 | (2006.01) |
| H01L 21/3065 | (2006.01) |
| H01L 21/762 | (2006.01) |
| H01L 21/3213 | (2006.01) |

(52) U.S. Cl.
CPC .......... *H01L 21/302* (2013.01); *H01L 21/3065* (2013.01); *H01L 21/30604* (2013.01); *H01L 21/76254* (2013.01); *H01L 21/32134* (2013.01); *H01L 21/32137* (2013.01)

(58) Field of Classification Search
USPC ......... 438/115, 120, 197, 289, 406, 455–459, 438/747, 753; 257/E21.013, E21.102, 257/E21.133, E21.219
See application file for complete search history.

(56) References Cited

U.S. PATENT DOCUMENTS

| | | | |
|---|---|---|---|
| 5,024,723 A | 6/1991 | Goesele et al. | |
| 5,223,081 A * | 6/1993 | Doan | 438/703 |
| 5,371,037 A | 12/1994 | Yonehara | |
| 5,374,564 A | 12/1994 | Bruel et al. | |
| 5,641,380 A | 6/1997 | Yamazaki et al. | |
| 5,677,207 A | 10/1997 | Ha | |
| 5,750,000 A | 5/1998 | Yonehara et al. | |

(Continued)

FOREIGN PATENT DOCUMENTS

| | | | |
|---|---|---|---|
| EP | 0793263 A2 | 9/1997 | |
| EP | 1480265 A2 | 11/2004 | |

(Continued)

OTHER PUBLICATIONS

Feijoo et al., Etch Stop Barriers in Silicon Produced by Ion Implantation of Electrically Non-Active Species, J. Electrochem. Soc., vol. 139, No. 8, Aug. 1992, pp. 2309-2314.

(Continued)

*Primary Examiner* — Charles Garber
*Assistant Examiner* — Abdulfattah Mustapha
(74) *Attorney, Agent, or Firm* — TraskBritt

(57) ABSTRACT

Methods of fabricating semiconductor devices include forming a metal silicide in a portion of a crystalline silicon layer, and etching the metal silicide using an etchant selective to the metal silicide relative to the crystalline silicon to provide a thin crystalline silicon layer. Silicon-on-insulator (SOI) substrates may be formed by providing a layer of crystalline silicon over a base substrate with a dielectric material between the layer of crystalline silicon and the base substrate, and thinning the layer of crystalline silicon by forming a metal silicide layer in a portion of the crystalline silicon, and then etching the metal silicide layer using an etchant selective to the metal silicide layer relative to the crystalline silicon.

35 Claims, 8 Drawing Sheets

(56) References Cited

U.S. PATENT DOCUMENTS

| | | | |
|---|---|---|---|
| 5,767,020 | A | 6/1998 | Sakaguchi et al. |
| 5,856,229 | A | 1/1999 | Sakaguchi et al. |
| 5,863,830 | A | 1/1999 | Bruel et al. |
| 5,869,387 | A | 2/1999 | Sato et al. |
| 5,980,633 | A | 11/1999 | Yamagata et al. |
| 6,008,110 | A | 12/1999 | Samata et al. |
| 6,066,529 | A | 5/2000 | Lin et al. |
| 6,121,117 | A | 9/2000 | Sato et al. |
| 6,136,684 | A | 10/2000 | Sato et al. |
| 6,169,000 | B1 | 1/2001 | Ohkubo |
| 6,180,497 | B1 | 1/2001 | Sato et al. |
| 6,303,468 | B1 | 10/2001 | Aspar |
| 6,335,258 | B1 | 1/2002 | Aspar et al. |
| 6,350,702 | B2 | 2/2002 | Sakaguchi |
| 6,380,099 | B2 | 4/2002 | Sakaguchi et al. |
| 6,410,436 | B2 | 6/2002 | Yamagata et al. |
| 6,433,615 | B2 | 8/2002 | Nagano |
| 6,653,209 | B1 | 11/2003 | Yamagata |
| 6,756,286 | B1 | 6/2004 | Moriceau et al. |
| 6,809,044 | B1 | 10/2004 | Aspar et al. |
| 6,946,365 | B2 | 9/2005 | Aspar |
| 7,081,399 | B2 | 7/2006 | Maleville et al. |
| RE39,484 | E | 2/2007 | Bruel |
| 7,235,427 | B2 | 6/2007 | Barge et al. |
| 7,833,877 | B2 | 11/2010 | Bourdelle et al. |
| 2004/0248348 | A1 | 12/2004 | Rausch et al. |
| 2005/0014346 | A1 | 1/2005 | Mitani et al. |
| 2007/0249139 | A1 | 10/2007 | Gadkaree et al. |
| 2008/0296565 | A1* | 12/2008 | Park et al. ............. 257/40 |
| 2009/0258475 | A1 | 10/2009 | Endo et al. |
| 2009/0309228 | A1* | 12/2009 | Fang et al. .......... 257/769 |
| 2011/0073184 | A1* | 3/2011 | Noda .................. 136/261 |
| 2011/0278678 | A1* | 11/2011 | Fukushima et al. ...... 257/369 |

FOREIGN PATENT DOCUMENTS

| | | | |
|---|---|---|---|
| EP | 1914799 | A1 | 4/2008 |
| JP | 2608351 | B2 | 5/1997 |
| JP | 2007158299 | A * | 6/2007 |
| WO | 2006103256 | A1 | 10/2006 |

OTHER PUBLICATIONS

French Preliminary Search Report and Opinion for French Application No. 1252148 dated Jan. 4, 2013, 6 pages.

Alavi et al., Fabrication of Microchannels by Laser Machining and Anisotropic Etching of Silicon, Sensors and Actuators A, vol. 32 (1992) pp. 299-302.

Alavi et al., Monolithic Microbridges in Silicon using Laser Machining and Anisotropic Etching, Sensors and Actuators A, vol. 37-37 (1993) pp. 661-665.

Chang et al., Selective Etching of SiGe on SiGe/Si Heterostructures, J. Electrochenn. Soc., vol. 138, No. 1, Jan. 1991, pp. 202-204.

Liou et al., Amorphous Silicon Produced by Ion Implantation, Etching Rate in HF Solution and Effect of Annealing, J. Electrochem. Soc. Solid-State Science and Technology, Mar. 1984, vol. 131, No. 3, pp. 674-672.

Sadaka et al., U.S. Appl. No. 13/402,450 entitled, Methods of Providing Thin Layers of Semiconductor Material, and Related Structures and Devices, filed Feb. 22, 2012.

Sadaka et al., U.S. Appl. No. 13/402,450 entitled, Methods of Thinning Semiconductor Materials in the Fabrication of Semiconductor Devices, and Devices and Structures Formed by Such Methods, filed Feb. 22, 2012.

Kawasegi et al., Depth Control of a Silicon Structure Fabricated by 100q ke V Ar Ion Beam Lithography, Applied Surface Science, vol. 253 (2007) pp. 3284-3291.

Von Gutfeld et al., Laser Enhanced Etching in KOH, 320 Applied Physics Letters, vol. 40, No. 4 (1982) pp. 352-354.

Sadaka et al., U.S. Appl. No. 13/402,483 entitled, Methods of Thinning Semiconductor Materials in the Fabrication of Semiconductor Devices, and Devices and Structures Formed by Such Methods, filed Feb. 22, 2012.

* cited by examiner

METHODS OF PROVIDING THIN LAYERS OF CRYSTALLINE SEMICONDUCTOR MATERIAL, AND RELATED STRUCTURES AND DEVICES

CROSS-REFERENCE TO RELATED APPLICATIONS

The subject matter of this application is related to the subject matter of U.S. patent application Ser. No. 13/402,450, which was filed on Feb. 22, 2012, now abandoned, and is also related to U.S. patent application Ser. No. 13/402,483, which was filed on Feb. 22, 2012, now abandoned, which are hereby incorporated herein in their entirety by this reference.

TECHNICAL FIELD

The present disclosure relates to methods of providing a thin layer of semiconductor material on a recipient structure in processes employed in semiconductor device fabrication, and to structures and devices fabricated using such methods.

BACKGROUND

In semiconductor device fabrication processes, thin layers of semiconductor material are provided on recipient structures for various purposes including, for example, fabrication of semiconductor-on-insulator (SeOI) type substrates, and to vertically stack semiconductor materials and devices in so-called "three-dimensional (3D) integration" processes.

In such processes, it may be desirable to provide a layer of semiconductor material on a recipient structure that has an average layer thickness as small as several hundred nanometers or less, and even one hundred nanometers (100 nm) or less in some applications. Also, it is desirable that the layer of semiconductor material have a uniform thickness (e.g., a non-uniformity being less than 5% of a thickness of the layer of semiconductor material. Additionally, it may be desirable that the layer of semiconductor material be extremely smooth. For example, it may be desirable to form the layer of semiconductor material such that the exposed major surface of the layer of semiconductor material has a surface roughness (Ra) as low as five nanometers (5 nm) or less.

Various methods of providing such thin and smooth layers of semiconductor material on recipient structures have been proposed in the art. There remains a need in the art, however, for improved methods that enable a thin, uniform and smooth layer of semiconductor material to be provided on a recipient structure.

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes methods of fabricating semiconductor devices. In accordance with such methods, a layer of crystalline silicon is provided on a recipient structure, a metal silicide is formed in a portion of the crystalline silicon adjacent an exposed major surface of the layer of crystalline silicon, and the metal silicide is etched using an etchant selective to the metal silicide relative to the crystalline silicon.

In additional embodiments, the present disclosure includes methods of forming silicon-on-insulator (SOI) substrates. In such methods, a layer of crystalline silicon may be provided over a base substrate with a dielectric material between the layer of crystalline silicon and the base substrate, and the layer of crystalline silicon may be thinned to a thickness of about 500 nm or less. To thin the layer of crystalline silicon, a generally planar metal silicide layer is formed in a portion of the layer of crystalline silicon adjacent an exposed major surface of the layer of crystalline silicon, and the metal silicide layer is etched using an etchant selective to the metal silicide layer relative to the crystalline silicon.

Yet further embodiments of the disclosure include semiconductor structures and devices fabricated using such methods.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

FIG. 1 is a simplified cross-sectional view of a layer of crystalline silicon on a substrate with a dielectric material between the layer of crystalline silicon and the substrate;

FIG. 2 is a simplified cross-sectional view illustrating the structure of FIG. 1 after smoothing an exposed major surface of the layer of crystalline silicon;

FIG. 3 is a simplified cross-sectional view illustrating the structure of FIG. 2 after forming a metal silicide material in a portion of the layer of crystalline silicon;

FIG. 4 is a simplified cross-sectional view illustrating a remaining portion of the crystalline silicon after removal of the metal silicide material shown in FIG. 3;

FIG. 9 is a simplified cross-sectional view illustrating ions being implanted into a donor structure comprising bulk crystalline silicon to define a weakened ion implant plane therein;

FIG. 10 illustrates the donor structure of FIG. 9 bonded to a recipient structure comprising the substrate of FIG. 1;

FIG. 11 is a simplified cross-sectional view of a layer of crystalline silicon on a substrate with a dielectric material between the semiconductor material and the substrate, the layer of crystalline silicon including at least partially formed active device structures therein;

FIG. 12 is a simplified cross-sectional view illustrating the structure of FIG. 11 after smoothing an exposed major surface of the layer of crystalline silicon;

FIG. 13 is a simplified cross-sectional view illustrating the structure of FIG. 12 after forming a metal silicide material in a portion of the layer of crystalline silicon;

FIG. 14 is a simplified cross-sectional view illustrating a remaining portion of the crystalline silicon after removal of the metal silicide material shown in FIG. 13; and FIG. 15 is a simplified cross-sectional view illustrating yet further layers of active device structures formed over the structure of FIG. 14 in a 3D integration process.

DETAILED DESCRIPTION

The illustrations presented herein are not meant to be actual views of any particular semiconductor material, structure, device, or method, but are merely idealized representations that are used to describe embodiments of the disclosure.

Any headings used herein should not be considered to limit the scope of embodiments of the invention as defined by the claims below and their legal equivalents. Concepts described in any specific heading are generally applicable in other sections throughout the entire specification.

A number of references are cited herein, the entire disclosures of which are incorporated herein in their entirety by this reference for all purposes. Further, none of the cited references, regardless of how characterized herein, is admitted as prior art relative to the invention of the subject matter claimed herein.

As used herein, the term "III-V semiconductor material" means and includes any semiconductor material that is at least predominantly comprised of one or more elements from group IIIA of the periodic table (B, Al, Ga, In, and Ti) and one or more elements from group VA of the periodic table (N, P, As, Sb, and Bi). For example, III-V semiconductor materials include, but are not limited to, GaN, GaP, GaAs, InN, InP, InAs, AlN, AlP, AlAs, InGaN, InGaP, GaInN, GaInNP, GaInNAs, etc.

Embodiments of methods disclosed herein may be employed to thin a layer of material in the fabrication of semiconductor devices to provide a layer of crystalline silicon having a selected, desirable average layer thickness.

Figure 1:
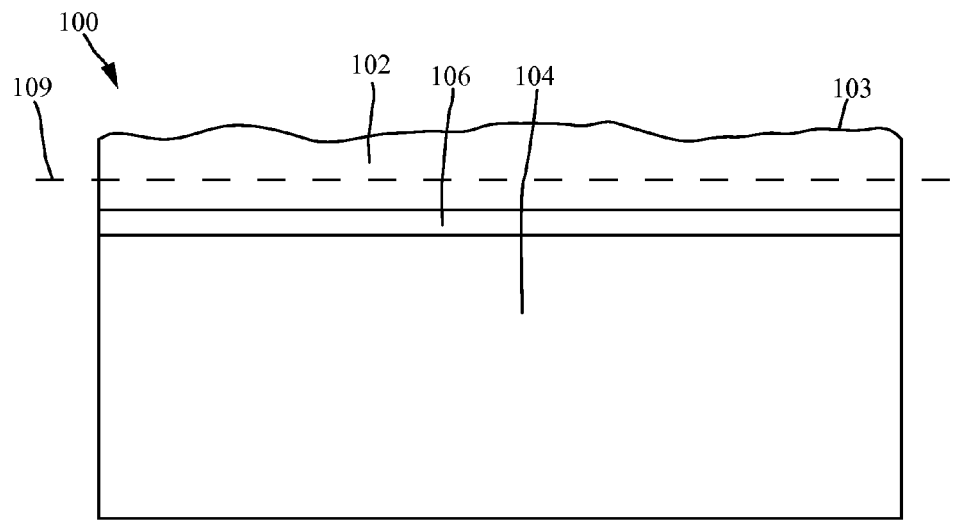
FIGS. 1 through 4 illustrate example embodiments of methods that may be used to thin a layer of crystalline silicon in the fabrication of semiconductor devices.

FIG. 1 illustrates a semiconductor structure 100 that includes a layer of crystalline silicon 102 comprising a crystalline silicon, a substrate 104, and an intermediate layer 106 between the layer of crystalline silicon 102 and the substrate 104. In this configuration, the semiconductor structure 100 may comprise a silicon-on-insulator (SOI) type substrate. The substrate 104 may comprise a recipient structure on which the layer of crystalline silicon 102 is provided.

The layer of crystalline silicon 102 comprises crystalline silicon. In some embodiments, the layer of crystalline silicon 102 may comprise a single crystal of silicon. In other words, the crystalline silicon may comprise monocrystalline silicon. A portion of the layer of crystalline silicon 102 may be designated as an "active" portion, on and/or in which active device structures are to be fabricated (or have already been fabricated), and another portion of the layer of crystalline silicon 102 may comprise a sacrificial portion that is not intended to include such active devices structures. For example, the portion of the layer of crystalline silicon 102 below the plane 109 (from the perspective of FIG. 1) may comprise an active portion of the layer of crystalline silicon 102, and the portion of the layer of crystalline silicon 102 above the plane 109 (from the perspective of FIG. 1) may comprise a sacrificial portion of the layer of crystalline silicon 102.

The substrate 104 over which the layer of crystalline silicon 102 is disposed may comprise a semiconductor material (e.g., silicon, germanium, a III-V semiconductor material, etc.), a ceramic material, such as an oxide (e.g., aluminum oxide, silicon oxide, zirconium oxide, etc.), a nitride (e.g., silicon nitride), or a carbide (e.g., silicon carbide). In additional embodiments, the substrate 104 may comprise a metal substrate. For example, the substrate 104 may comprise one or more metals or metal alloys such as copper, molybdenum, or stainless steel. In additional embodiments, the substrate 104 may comprise a graphene substrate or a diamond substrate. In some embodiments, the substrate 104 may comprise a multilayer substrate (e.g., a semiconductor-on-insulator (SeOI) type substrate, such as a silicon-on-insulator (SOI) substrate or a germanium-on-insulator (GeOI) substrate). Other suitable substrates are known in the art and may be employed in embodiments of the present disclosure. In some embodiments, the substrate 104 may comprise an at least partially fabricated semiconductor device (e.g., a die or wafer), and may include one or more integrated circuits (e.g., an electronic signal processor circuit, a memory device circuit, etc.). By way of example and not limitation, the substrate 104 may be thicker than the layer of crystalline silicon 102, and may have an average layer thickness of, for example, about one micron (1 µm) or more, about ten microns (10 µm) or more, or even about one hundred microns (100 µm) or more.

The intermediate layer 106 may comprise, for example, an oxide such as silicon oxide ($SiO_2$). In such embodiments, the intermediate layer 106 may comprise what are often referred to in the art as "buried oxide" layers. Other suitable dielectric materials that may be employed in the intermediate layer 106 include nitrides (e.g., silicon nitride ($Si_3N_4$)) and oxynitrides (e.g., silicon oxynitride ($SiO_xN_y$)). In some embodiments, the intermediate layer 106 may comprise a bonding layer used to bond the layer of crystalline silicon 102 to the substrate 104. In such embodiments, the intermediate layer 106 may comprise a dielectric material, such as those mentioned above, a metal layer (e.g., a layer of copper, silver, aluminum, titanium, tungsten, etc.), or a layer of semiconductor material different from that of the layer of crystalline silicon 102. The intermediate layer 106 may comprise a continuous layer of material blanket deposited over one or both of the substrate 104 and the layer of crystalline silicon 102. In other embodiments, the intermediate layer 106 may not be continuous, and may be patterned so as to include recesses therein or apertures therethrough at various locations across the intermediate layer 106.

By way of example and not limitation, the intermediate layer 106 may be thinner than the layer of crystalline silicon 102, and have an average layer thickness of, for example, about one hundred nanometers (100 nm) or less, about fifty nanometers (50 nm) or less, or even about ten nanometers (10 nm) or less.

Figure 2:
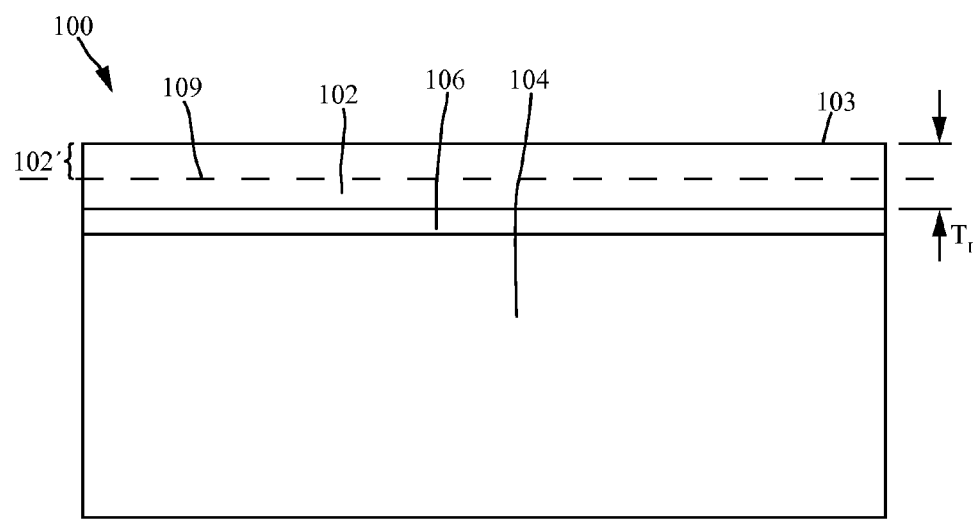

In accordance with embodiments of the disclosure, the layer of crystalline silicon 102 may be thinned to have a selected final thickness as discussed in further detail below. In some embodiments, an exposed surface 103 of the layer of crystalline silicon 102 may be relatively rough (as shown in an exaggerated manner in FIG. 1). Thus, prior to thinning the layer of crystalline silicon 102, the exposed major surface 103 of the layer of crystalline silicon 102 optionally may be smoothed as shown in FIG. 2 prior to thinning the layer of crystalline silicon 102. The exposed major surface 103 may be smoothed using, for example, one or more of a mechanical grinding or polishing process, a chemical etching process, a chemical-mechanical polishing (CMP) process, or an ion trimming process (e.g., using a cluster ion beam).

In some embodiments, the layer of crystalline silicon 102 may have an initial average layer thickness $T_I$ prior to thinning (as described below), which may be about five hundred nanometers (500 nm) or less, about two hundred nanometers (200 nm) or less, or even about one hundred nanometers (100 nm) or less In accordance with embodiments of the disclosure, the layer of crystalline silicon 102 may be thinned from the initial average layer thickness $T_I$ (FIG. 2) to a final average layer thickness $T_F$ (FIG. 4) by forming a metal silicide material in a portion 102' of the layer of crystalline silicon 102, and then removing the metal silicide material from the layer of crystalline silicon 102. For example, referring to FIG. 3, a portion 102' of the crystalline silicon adjacent an exposed major surface 103 of the layer of crystalline silicon 102 may be converted to metal silicide 112 (represented in FIG. 3 by stippling) to form the semiconductor structure 110. The metal silicide 112 may comprise a layer of metal silicide 112 having an average layer thickness of from about two nanometers (2 nm) to about ninety nanometers (90 nm). More particularly, the layer of metal silicide 112 may have an average layer thickness of from about five nanometers (5 nm) to about seventy nanometers (70 nm). More particularly still, the layer of metal silicide 112 may have an average layer thickness of from about ten nanometers (10 nm) to about fifty nanometers (50 nm).

Examples of methods that may be employed to form the layer of metal silicide 112 are described below with reference to FIGS. 7 and 8. In general, metal ions may be introduced into the layer of crystalline silicon, where the metal ions may react with silicon ions to form the metal silicide 112 compound.

Figure 7:
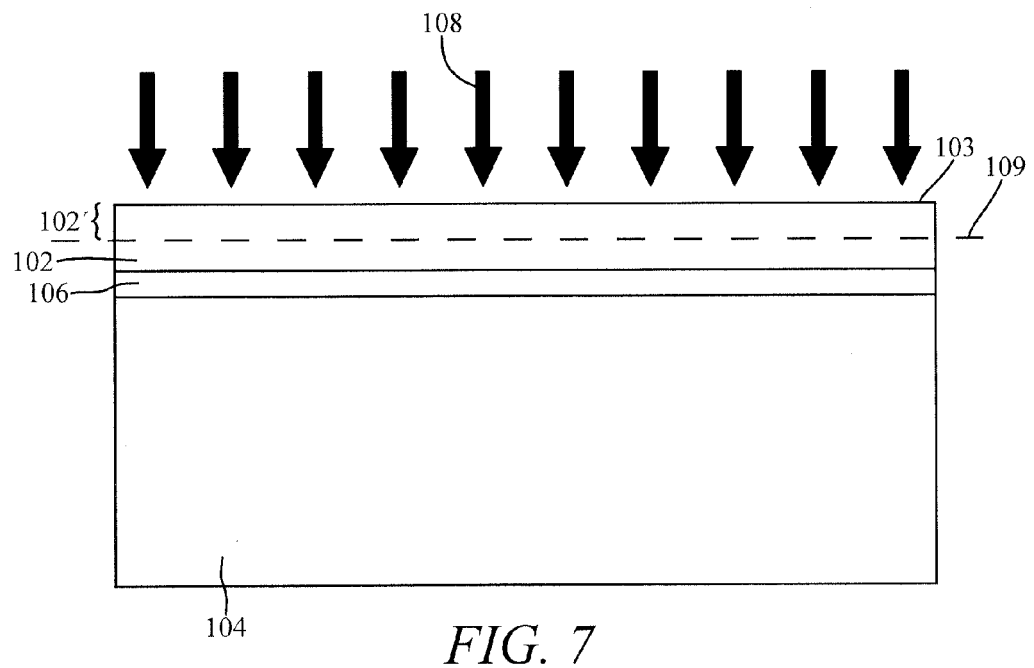
FIG. 7 is a cross-sectional view like that of FIG. 2 and illustrates metal ions being implanted into the layer of crystalline silicon to illustrate one embodiment of a method that may be used to form the metal silicide material in the portion of the layer of crystalline silicon as shown in FIG. 3.

Referring to FIG. 7, in some embodiments, metal ions may be implanted into the portion 102' of the layer of crystalline silicon 102 through the major surface 103 as represented by the directional arrows 108 to convert the crystalline silicon in the portion 102' into a metal silicide 112. The energy of the metal ions may be selectively tailored such that the metal ions are implanted up to a selected depth D into the layer of crystalline silicon 102 from the major surface 103. The depth D may be selected to be located above, but proximate to, a boundary of an intended active layer within the crystalline silicon of the layer of crystalline silicon 102. Further, the energy of the implanted metal ions, as well as the dose of implanted metal ions to which the portion 102' of the layer of crystalline silicon 102 is subjected, may be selected to reduce or minimize the so called "end-of range" or "EOR" defects in the layer of crystalline silicon 102. Thus, a layer of metal silicide 112 having a selected layer thickness that is less than the initial layer thickness $T_I$ (FIG. 2) of the layer of crystalline silicon 102 may be formed within the layer of crystalline silicon 102 adjacent the major surface 103 thereof.

The metal ions implanted into the layer of crystalline silicon 102 may comprise elemental metal ions. Such elemental metal ions may comprise elements that, together with the silicon atoms in the layer of crystalline silicon 102, will form the metal silicide 112. For example, if the metal silicide 112 is to comprise nickel silicide (e.g., $Ni_2Si$), the metal ions may comprise nickel ions. If the metal silicide 112 is to comprise titanium silicide (e.g., $TiSi_2$), the metal ions may comprise titanium ions. If the metal silicide 112 is to comprise tungsten silicide (e.g., $WSi_2$), the metal ions may comprise tungsten ions. As yet another example, if the metal silicide 112 is to comprise cobalt silicide (e.g., $CoSi_2$), the metal ions may comprise cobalt ions. The metal silicide 112 may form upon implantation of the metal ions into the layer of crystalline silicon 102 without requiring further processing to form the metal silicide 112. In other embodiments, after implanting the metal ions into the portion 102' of the layer of crystalline silicon 102, the structure may be subjected to an annealing process (e.g., elevated temperatures) to form the metal silicide 112.

Figure 3:
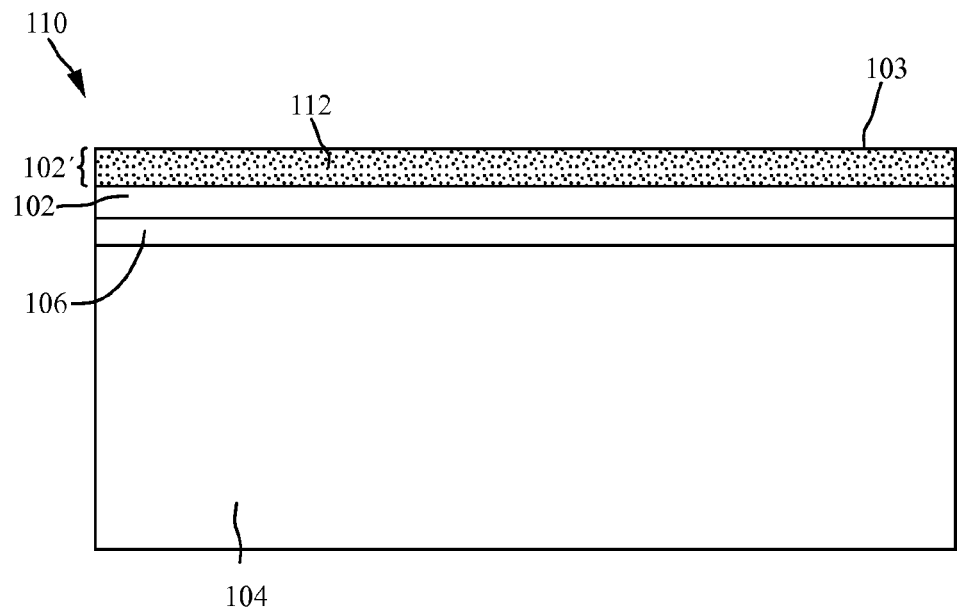
Figure 8:
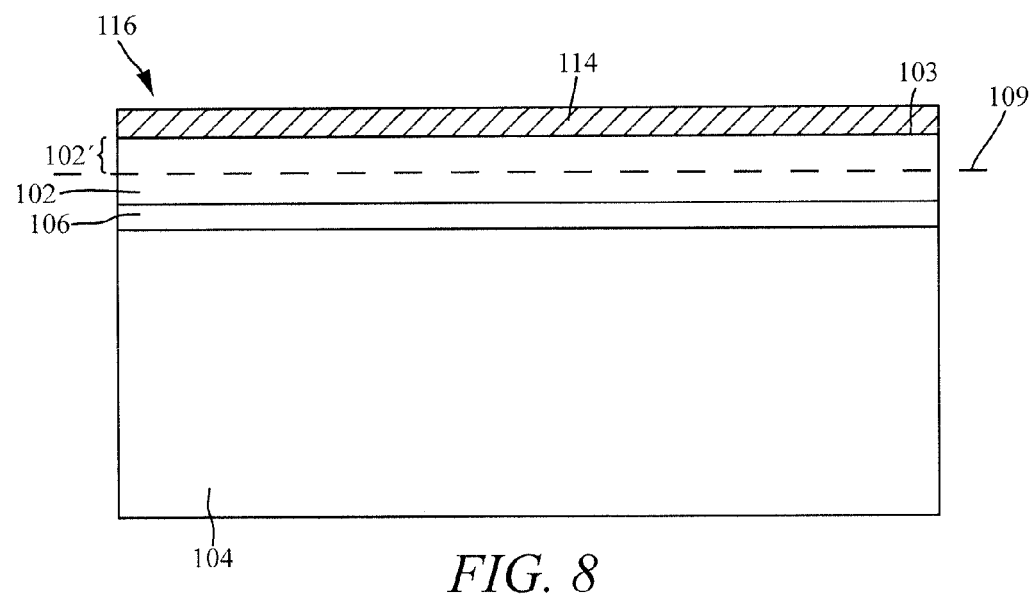
FIG. 8 is a cross-sectional view like that of FIG. 2 and illustrates a metal layer deposited over the layer of crystalline silicon prior to an annealing process to illustrate another embodiment of a method that may be used to form the metal silicide material in the portion of the layer of crystalline silicon as shown in FIG. 3.

Referring to FIG. 8, in additional embodiments, the metal silicide 112 may be formed in the portion 102' of the layer of crystalline silicon 102 by depositing a layer of metal 114 over the layer of crystalline silicon 102 to form the structure 116, and subsequently annealing the structure 116 at elevated temperatures so as to allow the metal elements or elements of the metal 114 to diffuse into the layer of crystalline silicon 102 and form the metal silicide 112 (FIG. 3).

For example, the layer of metal 114 may comprise a layer of one or more of titanium, nickel, tungsten, and cobalt. The layer of metal 114 may have an average layer thickness of, for example, from about ten nanometers (10 nm) to several microns or more.

The annealing process may be conducted in a furnace. In some embodiments, the annealing process may comprise a rapid thermal annealing (RTA) process, a flash annealing process, or a laser annealing process. The annealing process may be carried out at a temperature and for a time selected to control the depth into the layer of crystalline silicon 102 by which the metal elements diffuse, and, hence, the thickness of the resulting layer of metal silicide 112 formed therein. It is noted that the silicidation may be retarded by highly doping the silicon. Thus, in some embodiments, a portion of the layer of crystalline silicon 102 may be highly doped (e.g., either N doped or P doped), and the doped portion may act as a barrier to the silicidation process. The thickness of the doped portion may be selectively controlled, or at least the location of the doped silicon region within the layer of crystalline silicon 102, such that the depth into the layer of crystalline silicon 102 at which metal silicide 112 is formed is selectively controlled.

If any of the layer of metal 114 remains after the annealing process, the remaining portion of the layer of metal 114 may be removed using, for example, a polishing process, an etching process, an ion trimming process, or a combination of such processes, prior to further processing.

In some embodiments, the process or processes used to form the metal silicide 112 may be conducted at relatively low temperatures to avoid unintentional damage to other portions of the layer of crystalline silicon 102 and/or to any active device structures therein. For example, the metal silicide 112 may be formed in the portion 102' at a temperature of about seven hundred degrees Celsius (700° C.) or less, about five hundred degrees Celsius (500° C.) or less, or even about three hundred degrees Celsius (300° C.) or less. For example, nickel silicide (e.g., $Ni_2Si$) may form at a temperature of approximately 300° C., and titanium silicide (e.g., $TiSi_2$) may form at temperatures between about 400° C. and about 500° C.

Figure 4:
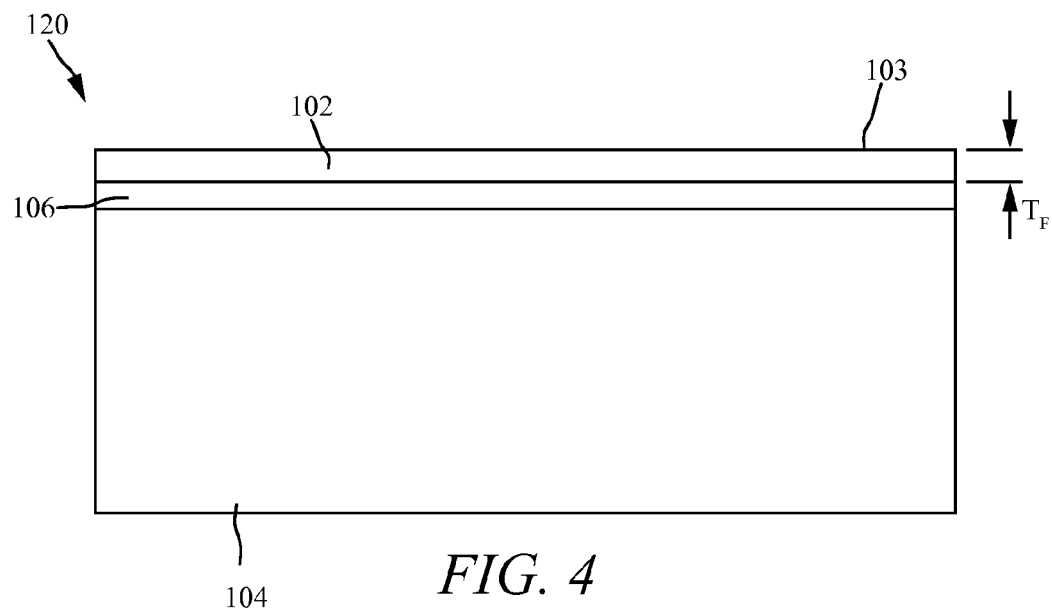

Referring to FIG. 4, after forming the metal silicide 112 (FIG. 3) in the portion 102' (FIG. 2) of the layer of crystalline silicon 102, the metal silicide 112 may be etched and removed using an etchant selective to the metal silicide 112 relative to the crystalline silicon to form the semiconductor structure 120. Stated another way, an etchant may be selected that will etch the metal silicide 112 in the portion 102' at a first etch rate that is higher than a second etch rate at which the etchant will etch the layer of crystalline silicon 102. The first etch rate may be at least about ten (10) times higher than the second etch rate, at least about one hundred (100) times higher than the second etch rate, or even at least about one thousand (1,000) times higher than the second etch rate in some embodiments. In this configuration, the layer of crystalline silicon 102 may serve as an etch stop layer in the etching process used to remove the overlying metal silicide 112. In other words, as the metal silicide 112 is removed progressively from the exposed major surface 103 at the first etch rate, when the metal silicide 112 is at least substantially removed and an underlying surface of the crystalline silicon is exposed, the etching process will effectively stop, due to the fact that the etch rate will be significantly reduced to the slower, second etch rate.

The etching process used to etch the metal silicide 112 may comprise a wet etching process, a dry etching process (e.g., a plasma etching process), or an electrochemical etching process.

The composition of the etchant or etchants employed in the etching process will depend upon the composition of the metal silicide 112 and the crystalline silicon. Many suitable etchants for crystalline silicon are known in the art and may be employed in embodiments of the present disclosure. As one non-limiting example, the etchant may comprise hydrofluoric acid (HF). In such embodiments, the HF may or may not be diluted, and may be in the liquid state or in the vapor state. In some embodiments, the etchant may comprise buffered hydrofluoric acid (BHF).

In some embodiments, the etching process used to remove the metal silicide 112 may be conducted at a temperature of about one hundred degrees Celsius (100° C.) or less, about fifty degrees Celsius (50° C.) or less, or even about twenty-five degrees Celsius (25° C.) or less. Thus, the etching process may be carried out at room temperature, or even below room temperature in some embodiments. Such embodiments may find particular utility when the layer of crystalline silicon 102 includes previously fabricated active device structures as discussed in further detail below with reference to FIGS. 11 through 15.

With continued reference to FIG. 4, after thinning the layer of crystalline silicon 102 by converting a portion 102' of the layer of crystalline silicon 102 (FIG. 2) to a metal silicide 112 (FIG. 3) and subsequently removing the metal silicide 112, the layer of crystalline silicon 102 will have a final average layer thickness $T_F$ that is less than the initial average layer thickness $T_I$ (FIG. 2) of the layer of crystalline silicon 102. In some embodiments, the layer of crystalline silicon 102 may be formed to have a final average layer thickness $T_F$ of about five hundred nanometers (500 nm) or less, about one hundred nanometers (100 nm) or less, or even about fifty nanometers (50 nm) or less, after removing the metal silicide 112.

In some embodiments, the exposed major surface 103 of the layer of crystalline silicon 102 may be provided with an average surface roughness (Ra) of about five nanometers (5 nm) or less, or even about two nanometers (2 nm) or less, after removing the metal silicide 112. Optionally, after thinning the layer of crystalline silicon 102, the exposed major surface 103 of the layer of crystalline silicon 102 may be smoothed to reduce a surface roughness of the exposed major surface 103 to such values if needed or desirable.

For example, the exposed major surface 103 may be smoothed using one or more of a wet cleaning process, a chemical-mechanical polishing (CMP) process, a plasma cleaning process, and an ion trimming process. As a non-limiting example, the exposed major surface 103 may be subjected to the cleaning process known in the art as the "SC-1" cleaning process and/or the cleaning process known in the art as the "SC-2" cleaning process. In the SC-1 process, the semiconductor structure 120 may be cleaned with a 1:1:5 solution of ammonium hydroxide ($NH_4OH$), hydrogen peroxide ($H_2O_2$), and water ($H_2O$) at a temperature from about seventy-five degrees Celsius (75° C.) to about eighty degrees Celsius (80° C.), followed by cleaning with a 1:50 solution of hydrofluoric acid (HF) and water ($H_2O$) at a temperature of about twenty-five degrees Celsius (25° C.). The semiconductor structure 120 may be rinsed with de-ionized water before and after each cleansing step. In the SC-2 process, the semiconductor structure 120 may be cleaned with a 1:1:6 solution of hydrochloric acid (HCl), hydrogen peroxide ($H_2O_2$), and water ($H_2O$) at a temperature from about seventy-five degrees Celsius (75° C.) to about eighty degrees Celsius (80° C.). Again, the semiconductor structure 120 may be rinsed with de-ionized water before and after each cleansing step. In yet further embodiments, the major surface 103 of the layer of crystalline silicon 102 may be cleansed using ozone.

As previously mentioned, the semiconductor structure 120 shown in FIG. 4 may comprise a silicon-on-insulator (SOI) type substrate. The semiconductor structure 120 may be utilized to fabricate any of a number of various different types of semiconductor devices comprising one or more portions of the layer of crystalline silicon 102. Such semiconductor devices include, for example, electronic signal processors, memory devices, light-emitting diodes, laser diodes, photocells, etc.

Figure 5:
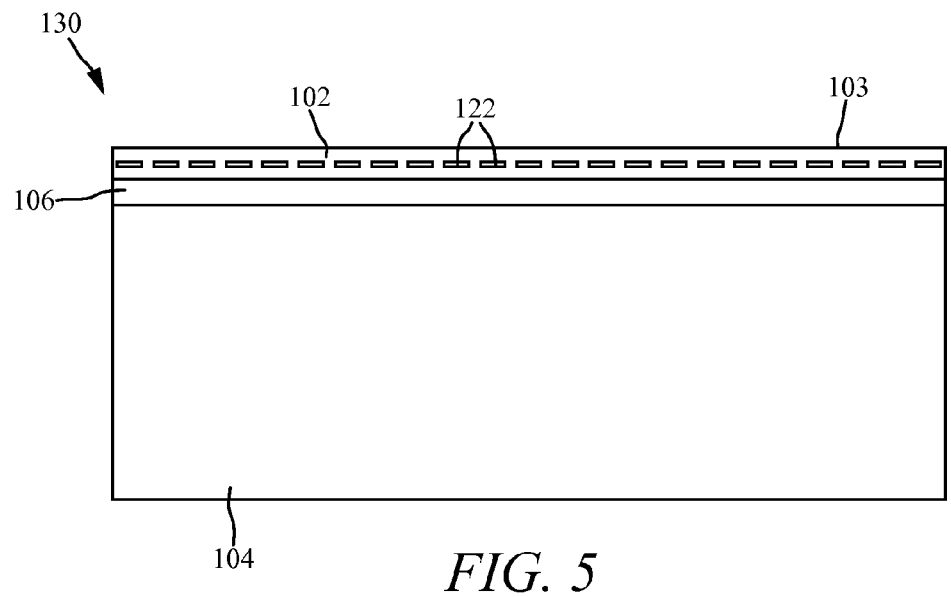
FIG. 5 is a simplified cross-sectional view illustrating active device structures that may be fabricated in and/or on the thinned layer of crystalline silicon of FIG. 4.

Referring to FIG. 5, to fabricate such semiconductor devices, active device structures 122 may be fabricated on and/or in the layer of crystalline silicon 102 to form the semiconductor structure 130. Such active device structures 122 may comprise, for example, one or more of PN junctions, transistors, conductive lines, and conductive vias.

Figure 6:
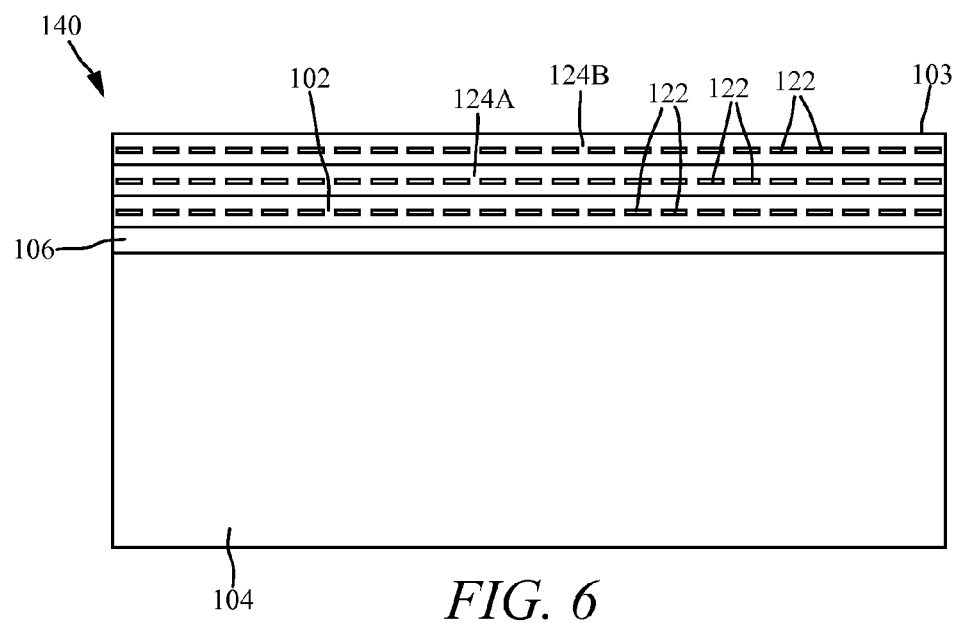
FIG. 6 is a simplified cross-sectional view illustrating yet further layers of active device structures formed over the structure of FIG. 5 in a 3D integration process.

Optionally, various additional layers of active device structures 122 may be provided over the active device structures 122 formed in and/or on the layer of crystalline silicon 102. For example, FIG. 6 illustrates another semiconductor structure 140 that includes two additional layers 124A, 124B provided over the active device structures 122 formed in and/or on the layer of crystalline silicon 102. Such additional layers 124A, 124B may be formed by depositing or epitaxially growing additional layers of crystalline silicon 102, and forming additional active device structures 122 in each respective layer of crystalline silicon 102. In additional embodiments, such additional layers 124A, 124B may be fabricated separately and subsequently transferred and bonded over the layer of crystalline silicon 102 using 3D integration processes.

Referring again to FIG. 1, in some embodiments, the initial semiconductor structure 100 may be provided by transferring the layer of crystalline silicon 102 from a donor structure to a recipient structure comprising the substrate 104. By way of example and not limitation, the process known in the art as the SMARTCUT® process may be used to transfer the layer of crystalline silicon 102 from a donor structure to the substrate 104. The SMARTCUT® process is described in, for example, U.S. Pat. No. RE39,484 to Bruel (issued Feb. 6, 2007), U.S. Pat. No. 6,303,468 to Aspar et al. (issued Oct. 16, 2001), U.S.

Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (issued Sep. 20, 2005), the disclosures of which are incorporated herein in their entireties by this reference.

Figure 9:
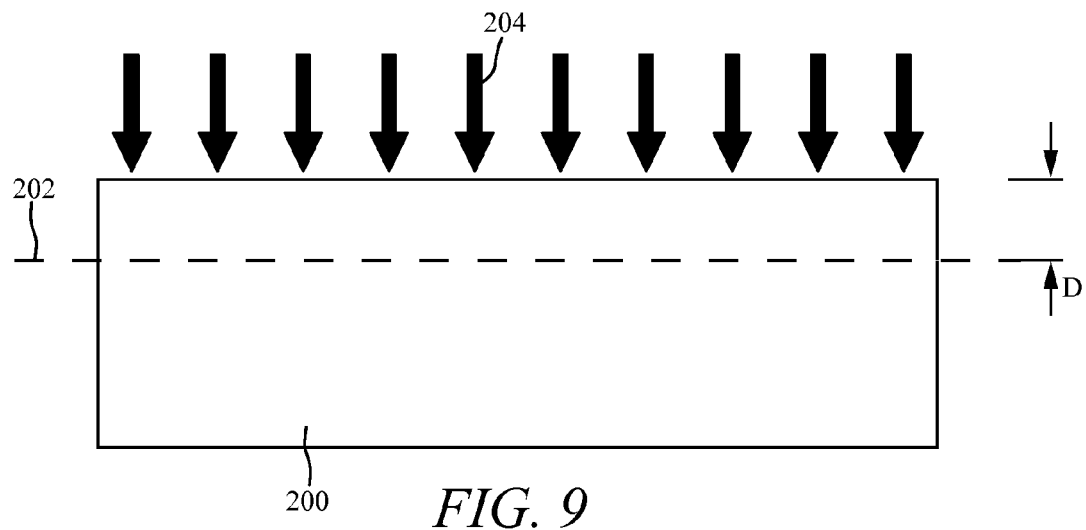
FIGS. 9 and 10 illustrate an example embodiment of a method that may be used to provide the structure shown in FIG. 1, which includes a layer of crystalline silicon over a substrate.

The SMARTCUT® process is briefly described below with reference to FIGS. 9 and 10. Referring to FIG. 9, a plurality of ions (e.g., one or more of hydrogen, helium, or inert gas ions) may be implanted into a donor structure 200 along an ion implant plane 202. The donor structure 200 may comprise bulk crystalline silicon (e.g., monocrystalline silicon). The implantation of ions is represented in FIG. 9 by directional arrows 204. The implanted ions along the ion implant plane 202 define a plane of weakness within the donor structure 200, along which the donor structure 200 subsequently may be cleaved or otherwise fractured. As known in the art, the depth at which the ions are implanted into the donor structure 200 is at least partially a function of the energy with which the ions are implanted into the donor structure 200. Generally, ions implanted with less energy will be implanted at relatively shallower depths, while ions implanted with higher energy will be implanted at relatively deeper depths.

Figure 10:
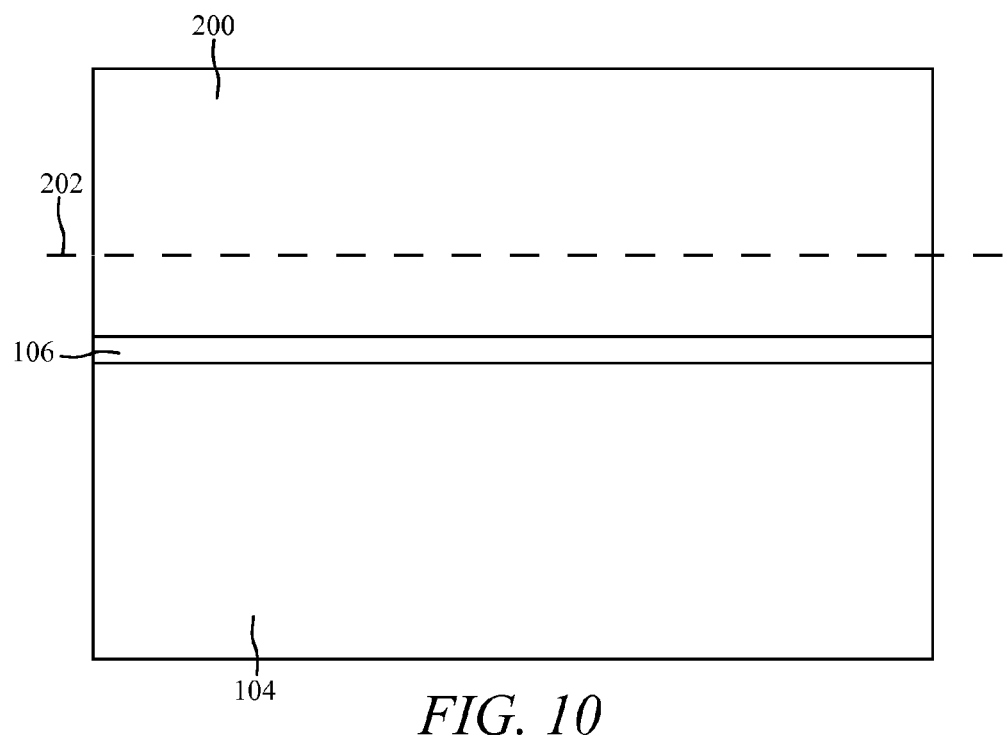

Referring to FIG. 10, the donor structure 200 is bonded to another recipient structure comprising the substrate 104, after which the donor structure 200 is cleaved or otherwise fractured along the ion implant plane 202. To bond the donor structure 200 to the substrate 104, the bonding surface of the donor structure 200 and the substrate 104 may be oxidized to provide a layer of oxide material thereon, and the oxide layers may be brought into direct physical contact so as to establish an oxide-to-oxide direct molecular bond between the substrate 104 and the donor structure 200. The bonded oxide layers together form the intermediate layer 106, as shown in FIG. 10. In additional embodiments, the intermediate layer 106 may comprise a metal or a semiconductor material formed by establishing direct molecular bonds between two layers of such materials.

After the bonding process, the bonded donor structure 200 may be cleaved or otherwise fractured along the ion implant plane 202 to form the structure shown in FIG. 1. For example, the donor structure 200 and the recipient structure may be heated to cause the donor structure 200 to fracture along the ion implant plane 202. Optionally, mechanical forces may be applied to the donor structure 200 to assist in the cleaving of the donor structure 200 along the ion implant plane 202.

After the donor structure 200 has been cleaved or otherwise fractured along the ion implant plane 202, a portion of the donor structure 200 remains bonded to the substrate 104 of the recipient structure, which portion defines the layer of crystalline silicon 102 shown in FIG. 1. A remainder of the donor structure 200 may be reused in further SMARTCUT® processes to transfer additional portions of the donor structure 200 to recipient structures.

After the fracturing process, the exposed major surface 103 of the layer of crystalline silicon 102 comprises a fractured surface of the donor structure 200, and may include ion impurities and imperfections in the crystal lattice of the layer of crystalline silicon 102. The layer of crystalline silicon 102 may be treated in an effort to reduce impurity levels and improve the quality of the crystal lattice (i.e., reduce the number of defects in the crystal lattice proximate the exposed major surface 103) in the layer of crystalline silicon 102. Such treatments may involve one or more of grinding, polishing, etching, and thermal annealing.

In other embodiments, the layer of crystalline silicon 102 may be provided over the substrate 104 by epitxially growing or otherwise depositing the layer of crystalline silicon 102 over the substrate 104 and the intermediate layer 106, or by bonding a bulk crystalline silicon over the substrate 104 and the intermediate layer 106 and subsequently thinning the bulk crystalline silicon to the initial average layer thickness $T_I$ using one or more of a grinding process, a polishing process, and an etching process (e.g., a chemical-mechanical polishing process).

In some embodiments, the layer of crystalline silicon 102 may be selected to comprise active device structures 122 therein prior to performing the thinning process described above with reference to FIGS. 3 and 4. Such methods are described below with reference to FIGS. 11 through 15.

Figure 11:
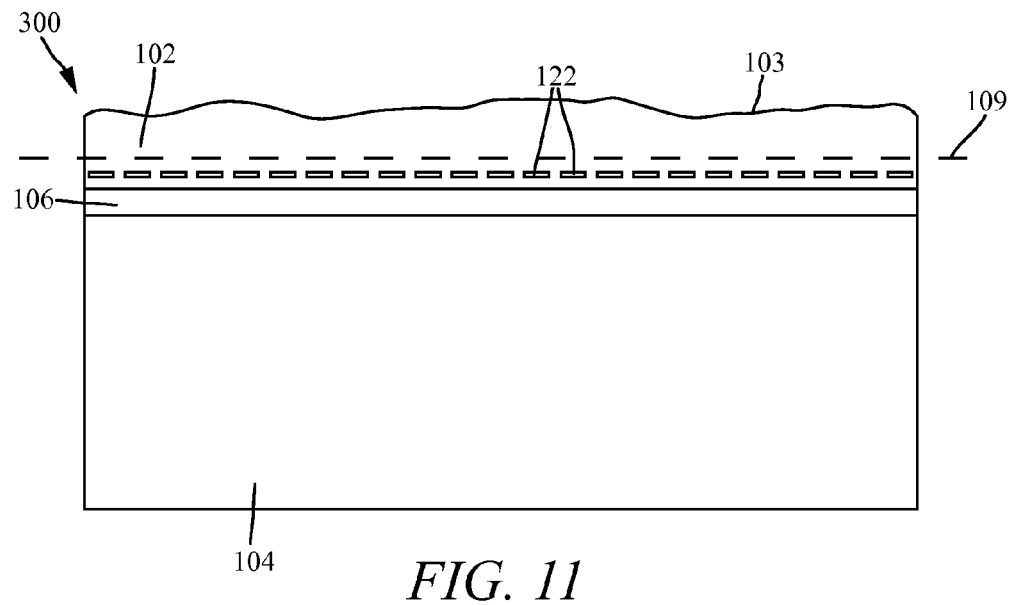
FIGS. 11 through 15 illustrate additional example embodiments of methods similar to those described with reference to FIGS. 1 through 10, but wherein the layer of crystalline silicon includes previously fabricated active device structures therein.

FIG. 11 illustrates a semiconductor structure 300 that includes a layer of crystalline silicon 102 and active device structures 122 formed on and/or in the crystalline silicon 102. The active device structures 122 may comprise, for example, one or more of PN junctions, transistors, conductive lines, and conductive vias. In some embodiments, the active device structures 122 may be buried within the layer of crystalline silicon 102. The layer of crystalline silicon 102 with the active device structures 122 therein may be transferred and bonded to the substrate 104 in a layer transfer process, in some embodiments.

Figure 12:
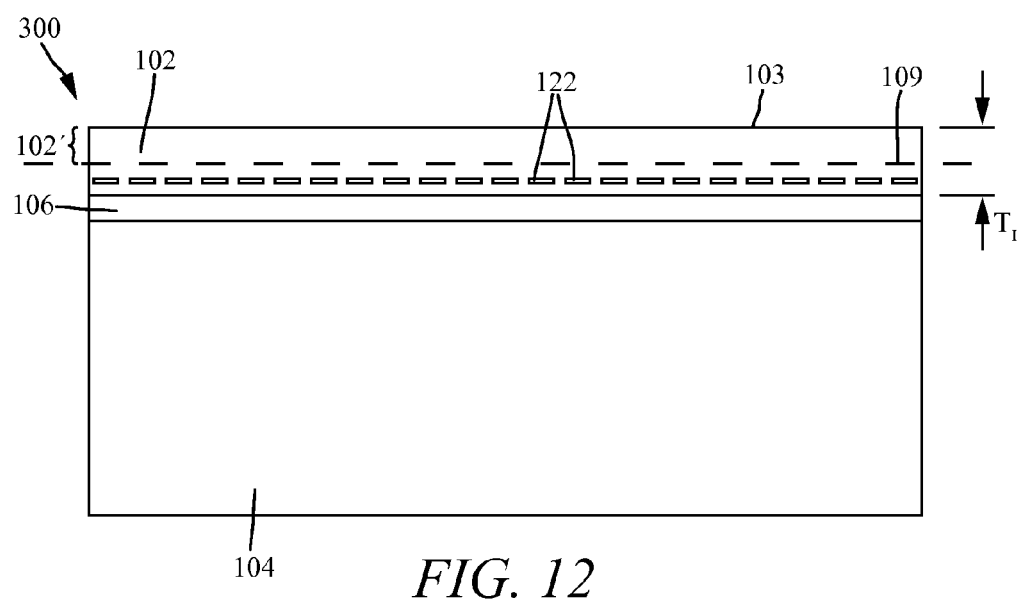

As shown in FIG. 12, prior to thinning the layer of crystalline silicon 102, the exposed major surface 103 of the layer of crystalline silicon 102 optionally may be smoothed as previously discussed with reference to FIG. 2. The exposed major surface 103 may be smoothed using, for example, one or more of a mechanical grinding or polishing process, a chemical etching process, and a chemical-mechanical polishing (CMP) process.

Figure 13:
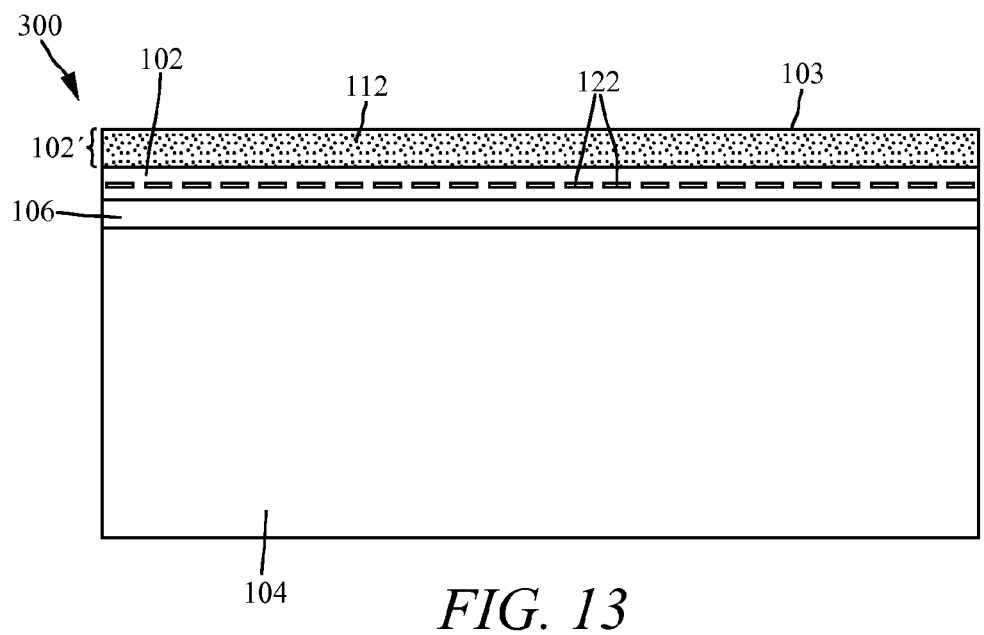

A portion 102' of the layer of crystalline silicon 102 may be converted to a metal silicide 112 to form the semiconductor structure 300 shown in FIG. 13. By way of example and not limitation, the metal silicide 112 may be formed using methods previously described with reference to FIGS. 7 and 8. In embodiments in which the layer of crystalline silicon 102 comprises active device structures 122, the metal silicide 112 may be formed in the portion 102' at a temperature of about seven hundred degrees Celsius (700° C.) or less, about five hundred degrees Celsius (500° C.) or less, or even about three hundred degrees Celsius (300° C.) or less, to avoid damaging the previously formed active device structures 122.

Figure 14:
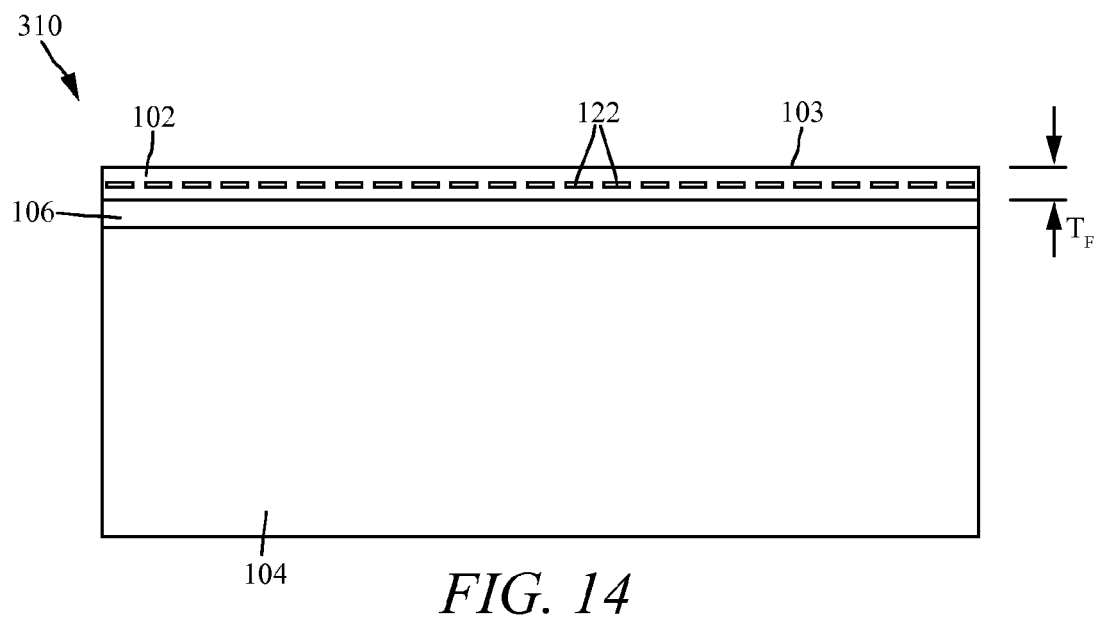

After forming the metal silicide 112 in the layer of semiconductor material 102, the metal silicide 112 may be removed using an etching process to form the semiconductor structure 310 shown in FIG. 14, as previously described with reference to FIG. 4. Thus, the layer of crystalline silicon 102 may be thinned from the initial average layer thickness $T_I$ shown in FIG. 12 to a selected final average layer thickness $T_F$ shown in FIG. 14.

Figure 15:
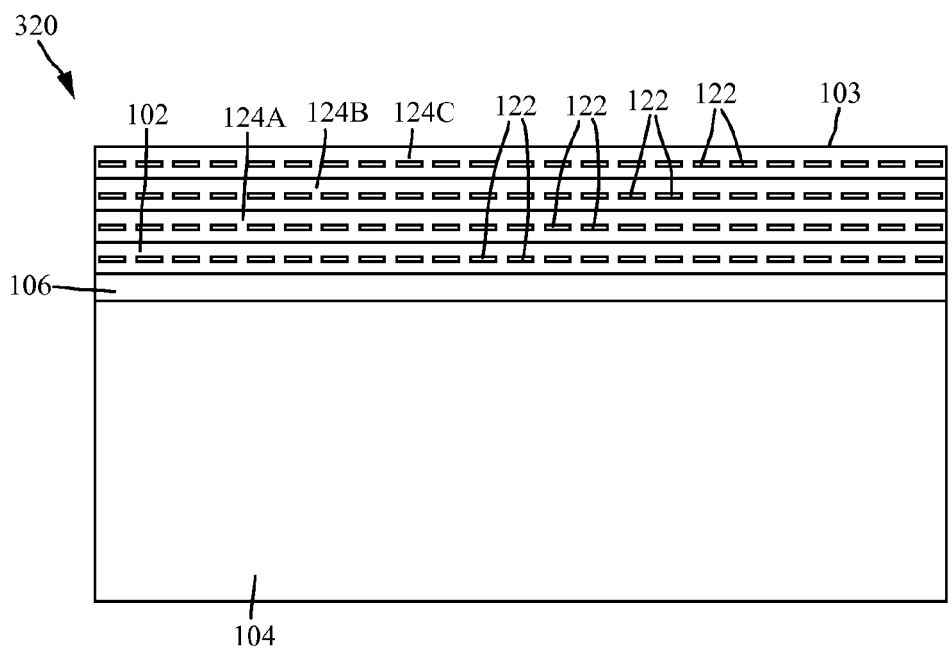

Optionally, various additional layers of active device structures 122 may be provided over the active device structures 122 and the layer of crystalline silicon 102. For example, FIG. 15 illustrates another semiconductor structure 320 that includes three additional layers 124A, 124B, 124C provided over the active device structures 122 and the layer of crystalline silicon 102. Such additional layers 124A, 124B, 124C may be formed by depositing or epitaxially growing additional layers of crystalline silicon, and forming additional active device structures 122 in each respective layer of crystalline silicon. In additional embodiments, such additional layers 124A, 124B, 124C may be fabricated separately and subsequently transferred and bonded over the layer of crystalline silicon 102 using 3D integration processes.

Additional non-limiting example embodiments of the disclosure are set forth below:

Embodiment 1: A method of fabricating a semiconductor device, comprising: providing a layer of crystalline silicon on a recipient structure; forming a metal silicide in a portion of the crystalline silicon adjacent an exposed major surface of the layer of crystalline silicon; and etching the metal silicide using an etchant selective to the metal silicide relative to the crystalline silicon.

Embodiment 2: The method of Embodiment 1, wherein providing the layer of crystalline silicon on the recipient structure comprises transferring the layer of crystalline silicon from a donor structure to the recipient structure.

Embodiment 3: The method of Embodiment 2, further comprising selecting the layer of crystalline silicon to comprise active device structures.

Embodiment 4: The method of Embodiment 3, further comprising selecting the layer of crystalline silicon to include one or more of PN junctions, transistors, conductive lines, and conductive vias.

Embodiment 5: The method of any one of Embodiments 1 through 4, further comprising selecting the crystalline silicon to comprise monocrystalline silicon.

Embodiment 6: The method of any one of Embodiments 1 through 5, wherein forming the metal silicide in the portion of the crystalline silicon adjacent the exposed major surface of the layer of crystalline silicon comprises: depositing metal over the exposed major surface of the layer of crystalline silicon; and annealing the deposited metal and the layer of crystalline silicon to form the metal silicide.

Embodiment 7: The method of any one of Embodiments 1 through 5, wherein forming the metal silicide in the portion of the crystalline silicon adjacent the exposed major surface of the layer of crystalline silicon comprises implanting metal ions into the crystalline silicon to form the metal silicide.

Embodiment 8: The method of Embodiment 7, further comprising selecting the metal ions to comprise at least one of titanium, nickel, cobalt, and tungsten.

Embodiment 9: The method of any one of Embodiments 1 through 8, wherein forming the metal silicide in the portion of the crystalline silicon comprises forming the metal silicide in the portion of the crystalline silicon at a temperature of about 700° C. or less.

Embodiment 10: The method of Embodiment 9, wherein forming the metal silicide in the portion of the crystalline silicon at a temperature of about 700° C. or less comprises forming the metal silicide in the portion of the crystalline silicon at a temperature of about 500° C. or less.

Embodiment 11: The method of Embodiment 10, wherein forming the metal silicide in the portion of the crystalline silicon at a temperature of about 500° C. or less comprises forming the metal silicide in the portion of the crystalline silicon at a temperature of about 300° C. or less.

Embodiment 12: The method of any one of Embodiments 1 through 11, wherein etching the metal silicide comprises etching the metal silicide using one or more of a wet etching process, a dry etching process, and an electrochemical etching process.

Embodiment 13: The method of any one of Embodiments 1 through 12, wherein etching the metal silicide comprises at least substantially removing the metal silicide and exposing a surface of the crystalline silicon.

Embodiment 14: The method of Embodiment 13, further comprising smoothing a surface of the crystalline silicon using one or more of a wet cleaning process, a chemical-mechanical polishing process, a plasma cleaning process, and an ion trimming process.

Embodiment 15: The method of any one of Embodiments 1 through 14, wherein etching the metal silicide comprises etching the metal silicide at a temperature of about one hundred degrees Celsius (100° C.) or less.

Embodiment 16: The method of Embodiment 15, wherein etching the metal silicide at the temperature of about one hundred degrees Celsius (100° C.) or less comprises etching the metal silicide at a temperature of about twenty-five degrees Celsius (25° C.) or less.

Embodiment 17: The method of any one of Embodiments 1 through 16, wherein etching the metal silicide using the etchant selective to the metal silicide relative to the crystalline silicon comprises etching the metal silicide with HF.

Embodiment 18: The method of any one of Embodiments 1 through 17, further comprising forming an SOI type substrate comprising the crystalline silicon, the recipient structure, and a dielectric layer therebetween.

Embodiment 19: The method of any one of Embodiments 1 through 18, further comprising forming one or more of an electronic signal processor, a memory device, a light-emitting diode, a laser diode, and a photocell comprising the crystalline silicon.

Embodiment 20: The method of any one of Embodiments 1 through 19, further comprising forming the layer of crystalline silicon to have an average layer thickness of about 500 nm or less after etching the metal silicide.

Embodiment 21: The method of Embodiment 20, further comprising forming the layer of crystalline silicon to have an average layer thickness of about 100 nm or less after etching the metal silicide.

Embodiment 22: The method of any one of Embodiments 1 through 21, further comprising providing an exposed major surface of the layer of crystalline silicon with an average surface roughness $R_a$ of about 5.0 nm or less after etching the metal silicide.

Embodiment 23: The method of Embodiment 22, further comprising providing the exposed major surface of the layer of crystalline silicon with an average surface roughness $R_a$ of about 2.0 nm or less after etching the metal silicide.

Embodiment 24: A method of forming a silicon-on-insulator (SOI) substrate, comprising: providing a layer of crystalline silicon over a base substrate with a dielectric material between the layer of crystalline silicon and the base substrate; and thinning the layer of crystalline silicon to a thickness of about 500 nm or less. Thinning the layer of crystalline silicon comprises: forming a generally planar metal silicide layer in a portion of the layer of crystalline silicon adjacent an exposed major surface of the layer of crystalline silicon; and etching the metal silicide layer using an etchant selective to the metal silicide layer relative to the crystalline silicon.

Embodiment 25: The method of Embodiment 24, wherein forming the metal silicide in the portion of the crystalline silicon adjacent the exposed major surface of the layer of crystalline silicon comprises: depositing metal over the exposed major surface of the layer of crystalline silicon; and annealing the deposited metal and the layer of crystalline silicon to form the metal silicide.

Embodiment 26: The method of Embodiment 24, wherein forming the metal silicide in the portion of the crystalline silicon adjacent the exposed major surface of the layer of crystalline silicon comprises implanting metal ions into the crystalline silicon to form the metal silicide.

Embodiment 27: The method of Embodiment 26, further comprising selecting the metal ions to comprise at least one of titanium, nickel, cobalt, and tungsten.

Embodiment 28: The method of any one of Embodiments 24 through 27, wherein forming the metal silicide in the portion of the crystalline silicon comprises forming the metal silicide in the portion of the crystalline silicon at a temperature of about 700° C. or less.

Embodiment 29: The method of Embodiment 28, wherein forming the metal silicide in the portion of the crystalline silicon at a temperature of about 700° C. or less comprises forming the metal silicide in the portion of the crystalline silicon at a temperature of about 500° C. or less.

Embodiment 30: The method of Embodiment 29, wherein forming the metal silicide in the portion of the crystalline silicon at a temperature of about 500° C. or less comprises forming the metal silicide in the portion of the crystalline silicon at a temperature of about 300° C. or less.

Embodiment 31: The method of any one of Embodiments 24 through 30, wherein etching the metal silicide comprises etching the metal silicide at a temperature of about one hundred degrees Celsius (100° C.) or less.

Embodiment 32: The method of Embodiment 31, wherein etching the metal silicide at the temperature of about one hundred degrees Celsius (100° C.) or less comprises etching the metal silicide at a temperature of about twenty-five degrees Celsius (25° C.) or less.

Embodiment 33: The method of any one of Embodiments 24 through 32, further comprising forming the layer of crystalline silicon to have an average layer thickness of about 100 nm or less after etching the metal silicide.

Embodiment 34: The method of any one of Embodiments 24 through 33, further comprising providing an exposed major surface of the layer of crystalline silicon with an average surface roughness $R_a$ of about 5.0 nm or less after etching the metal silicide.

Embodiment 35: The method of Embodiment 34, further comprising providing the exposed major surface of the layer of crystalline silicon with an average surface roughness $R_a$ of about 2.0 nm or less after etching the metal silicide.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. In other words, one or more features of one example embodiment described herein may be combined with one or more features of another example embodiment described herein to provide additional embodiments of the disclosure. Such modifications and embodiments are also intended to fall within the scope of the appended claims.

What is claimed is:

1. A method of fabricating a semiconductor device, comprising:
    providing a layer of crystalline silicon on a recipient structure; and
    after providing the layer of crystalline silicon on the recipient structure, reducing a thickness of the layer of crystalline silicon, reducing the thickness including:
        forming a layer consisting essentially of metal silicide in a portion of the crystalline silicon adjacent an exposed major surface of the layer of crystalline silicon, wherein forming the layer consisting essentially of the metal silicide comprises implanting metal ions into the crystalline silicon to form the layer consisting essentially of the metal silicide; and
        after forming the layer consisting essentially of the metal silicide, etching the layer consisting essentially of the metal silicide using an etchant selective to the metal silicide relative to the crystalline silicon, the etchant removing the metal silicide at an etch rate higher than any etch rate at which the metal silicide removes the crystalline silicon.

2. The method of claim 1, wherein providing the layer of crystalline silicon on the recipient structure comprises transferring the layer of crystalline silicon from a donor structure to the recipient structure.

3. The method of claim 2, further comprising selecting the layer of crystalline silicon to comprise active device structures.

4. The method of claim 3, further comprising selecting the layer of crystalline silicon to include one or more of PN junctions, transistors, conductive lines, and conductive vias.

5. The method of claim 1, further comprising selecting the crystalline silicon to comprise monocrystalline silicon.

6. A method of fabricating a semiconductor device, comprising:
    providing a layer of crystalline silicon on a recipient structure; and
    after providing the layer of crystalline silicon on the recipient structure, reducing a thickness of the layer of crystalline silicon, reducing the thickness including:
        forming a layer consisting essentially of metal silicide in a portion of the crystalline silicon adjacent an exposed major surface of the layer of crystalline silicon at a temperature of about 700° C. or less, wherein forming the layer consisting essentially of the metal silicide comprises:
            depositing metal over the exposed major surface of the layer of crystalline silicon; and
            annealing the deposited metal and the layer of crystalline silicon to form the layer consisting essentially of metal silicide; and
        after forming the layer consisting essentially of the metal silicide, etching the layer consisting essentially of metal silicide using an etchant selective to the metal silicide relative to the crystalline silicon, the etchant removing the metal silicide at an etch rate higher than any etch rate at which the metal silicide removes the crystalline silicon.

7. The method of claim 1, further comprising selecting the metal ions to comprise at least one of titanium, nickel, cobalt, and tungsten.

8. The method of claim 1, wherein forming the layer consisting essentially of metal silicide in the portion of the crystalline silicon comprises forming the layer consisting essentially of metal silicide in the portion of the crystalline silicon at a temperature of about 700° C. or less.

9. The method of claim 8, wherein forming the layer consisting essentially of metal silicide in the portion of the crystalline silicon at a temperature of about 700° C. or less comprises forming the layer consisting essentially of metal silicide in the portion of the crystalline silicon at a temperature of about 500° C. or less.

10. The method of claim 9, wherein forming the layer consisting essentially of metal silicide in the portion of the crystalline silicon at a temperature of about 500° C. or less comprises forming the layer consisting essentially of metal silicide in the portion of the crystalline silicon at a temperature of about 300° C. or less.

11. The method of claim 1, wherein etching the layer consisting essentially of metal silicide comprises etching the layer consisting essentially of metal silicide using one or more of a wet etching process, a dry etching process, and an electrochemical etching process.

12. The method of claim 1, wherein etching the layer consisting essentially of metal silicide comprises at least substantially removing the layer consisting essentially of metal silicide and exposing a surface of the crystalline silicon.

13. The method of claim 12, further comprising smoothing a surface of the crystalline silicon using one or more of a wet cleaning process, a chemical-mechanical polishing process, a plasma cleaning process, and an ion trimming process.

14. The method of claim 1, wherein etching the layer consisting essentially of metal silicide comprises etching the layer consisting essentially of metal silicide at a temperature of about one hundred degrees Celsius (100° C.) or less.

15. The method of claim 1, wherein etching the layer consisting essentially of metal silicide at the temperature of about one hundred degrees Celsius (100° C.) or less comprises etching the layer consisting essentially of metal silicide at a temperature of about twenty-five degrees Celsius (25° C.) or less.

16. The method of claim 1, wherein etching the layer consisting essentially of metal silicide using the etchant selective to the metal silicide relative to the crystalline silicon comprises etching the metal silicide with HF.

17. The method of claim 1, further comprising forming an SOI type substrate comprising the crystalline silicon, the recipient structure, and a dielectric layer therebetween.

18. The method of claim 1, further comprising forming one or more of an electronic signal processor, a memory device, a light-emitting diode, a laser diode, and a photocell comprising the crystalline silicon.

19. The method of claim 1, further comprising forming the layer of crystalline silicon to have an average layer thickness of about 500 nm or less after etching the layer consisting essentially of metal silicide.

20. The method of claim 19, further comprising forming the layer of crystalline silicon to have an average layer thickness of about 100 nm or less after etching the layer consisting essentially of metal silicide.

21. The method of claim 1, further comprising providing an exposed major surface of the layer of crystalline silicon with an average surface roughness $R_a$ of about 5.0 nm or less after etching the metal silicide.

22. The method of claim 21, further comprising providing the exposed major surface of the layer of crystalline silicon with an average surface roughness $R_a$ of about 2.0 nm or less after etching the layer consisting essentially of metal silicide.

23. A method of forming a silicon-on-insulator (SOI) substrate, comprising:
    providing a layer of crystalline silicon over a base substrate with a dielectric material between the layer of crystalline silicon and the base substrate; and
    after providing the layer of crystalline silicon, thinning the layer of crystalline silicon to a thickness of about 500 nm or less, thinning the layer of crystalline silicon comprising:
        forming a generally planar metal silicide layer in a portion of the layer of crystalline silicon adjacent an exposed major surface of the layer of crystalline silicon; and
        etching the generally planar metal silicide layer using an etchant selective to the metal silicide layer relative to the crystalline silicon, the etchant removing the metal silicide at an etch rate higher than any etch rate at which the metal silicide removes the crystalline silicon.

24. The method of claim 23, wherein forming the generally planar metal silicide layer in the portion of the crystalline silicon adjacent the exposed major surface of the layer of crystalline silicon comprises:
    depositing metal over the exposed major surface of the layer of crystalline silicon; and
    annealing the deposited metal and the layer of crystalline silicon to form the generally planar metal silicide layer.

25. The method of claim 23, wherein forming the generally planar metal silicide layer in the portion of the crystalline silicon adjacent the exposed major surface of the layer of crystalline silicon comprises implanting metal ions into the crystalline silicon to form the generally planar metal silicide layer.

26. The method of claim 25, further comprising selecting the metal ions to comprise at least one of titanium, nickel, cobalt, and tungsten.

27. The method of claim 23, wherein forming the generally planar metal silicide layer in the portion of the crystalline silicon comprises forming the generally planar metal silicide layer in the portion of the crystalline silicon at a temperature of about 700° C. or less.

28. The method of claim 27, wherein forming the generally planar metal silicide layer in the portion of the crystalline silicon at a temperature of about 700° C. or less comprises forming the generally planar metal silicide layer in the portion of the crystalline silicon at a temperature of about 500° C. or less.

29. The method of claim 28, wherein forming the generally planar metal silicide layer in the portion of the crystalline silicon at a temperature of about 500° C. or less comprises forming the generally planar metal silicide layer in the portion of the crystalline silicon at a temperature of about 300° C. or less.

30. The method of claim 23, wherein etching the generally planar metal silicide layer comprises etching the metal silicide at a temperature of about one hundred degrees Celsius (100° C.) or less.

31. The method of claim 30, wherein etching the generally planar metal silicide layer at the temperature of about one hundred degrees Celsius (100° C.) or less comprises etching the generally planar metal silicide layer at a temperature of about twenty-five degrees Celsius (25° C.) or less.

32. The method of claim 23, further comprising forming the layer of crystalline silicon to have an average layer thickness of about 100 nm or less after etching the generally planar metal silicide layer.

33. The method of claim 23, further comprising providing an exposed major surface of the layer of crystalline silicon with an average surface roughness $R_a$ of about 5.0 nm or less after etching the generally planar metal silicide layer.

34. The method of claim 33, further comprising providing the exposed major surface of the layer of crystalline silicon with an average surface roughness $R_a$ of about 2.0 nm or less after etching the generally planar metal silicide layer.

35. The method of claim 1, further comprising selecting the crystalline silicon to comprise a single crystal of silicon.

* * * * *